United States Patent
Sakai et al.

(10) Patent No.: US 9,090,988 B2
(45) Date of Patent: Jul. 28, 2015

(54) METHOD OF PRODUCING CRYSTALS OF NITRIDES OF GROUP 13 ELEMENTS AND MELT COMPOSITIONS

(71) Applicant: NGK INSULATORS, LTD., Aichi-prefecture (JP)

(72) Inventors: Masahiro Sakai, Nagoya (JP); Makoto Iwai, Kasugai (JP)

(73) Assignee: NGK INSULATORS, LTD., Aichi-Prefecture (JP)

( * ) Notice: Subject to any disclaimer, the term of this patent is extended or adjusted under 35 U.S.C. 154(b) by 0 days.

(21) Appl. No.: 14/314,227

(22) Filed: Jun. 25, 2014

(65) Prior Publication Data

US 2014/0305369 A1    Oct. 16, 2014

Related U.S. Application Data

(63) Continuation of application No. PCT/JP2013/060412, filed on Mar. 29, 2013.

(30) Foreign Application Priority Data

Mar. 30, 2012 (JP) ................. 2012-079387

(51) Int. Cl.
*C30B 19/02* (2006.01)
*C30B 9/12* (2006.01)
*C30B 29/40* (2006.01)
*H01L 21/02* (2006.01)

(52) U.S. Cl.
CPC . *C30B 19/02* (2013.01); *C30B 9/12* (2013.01); *C30B 29/403* (2013.01); *C30B 29/406* (2013.01); *H01L 21/0242* (2013.01); *H01L 21/0254* (2013.01); *H01L 21/0262* (2013.01); *H01L 21/02458* (2013.01); *H01L 21/02573* (2013.01); *H01L 21/02625* (2013.01)

(58) Field of Classification Search
CPC ...... C30B 29/403; C30B 29/406; C30B 9/12; C30B 19/02; H01L 21/0242; H01L 21/02458; H01L 21/0245; H01L 21/02573; H01L 21/0262; H01L 21/02625

USPC ............ 117/68, 71, 73, 74, 75, 76, 952
See application file for complete search history.

(56) References Cited

U.S. PATENT DOCUMENTS

| | | | |
|---|---|---|---|
| 2009/0294909 A1 | 12/2009 | Nagai et al. | |
| 2010/0230713 A1 | 9/2010 | Minemoto et al. | |
| 2010/0247418 A1* | 9/2010 | Sato et al. | 423/409 |
| 2011/0175200 A1 | 7/2011 | Yoshida | |

FOREIGN PATENT DOCUMENTS

| | | |
|---|---|---|
| EP | 2423355 A1 | 2/2012 |
| JP | 4223540 B2 | 11/2008 |
| JP | 2010-001209 A | 1/2010 |
| JP | 2010-235330 A | 10/2010 |
| JP | 2011-148655 A | 8/2011 |

OTHER PUBLICATIONS

Mori, Y., et al., "Growth of GaN crystals by Na flux LPE method," Phys. Status Solidi A 2010;207(6):1283-1286.
Office Action from Korean Patent App. No. 10-2013-7032435 (Feb. 25, 2014).
International Search Report for PCT Patent App. No. PCT/JP2013/060412 (Jul. 9, 2013).
Written Opinion for PCT Patent App. No. PCT/JP2013/060412 (Jul. 9, 2013).
Oshima, Y., et al., "Properies of Ge-doped, high-quality bulk GaN crystals fabricated by hydride vapor phase epitaxy," J. Crystal Growth 2010;312:3569-3573.
Office Action from Korean Patent App. No. 10-2013-7032435 (Jun. 25, 2014).

* cited by examiner

*Primary Examiner* — Matthew Song
(74) *Attorney, Agent, or Firm* — Cermak Nakajima & McGowan LLP; Tomoko Nakajima

(57) ABSTRACT

It is provided a method of producing a crystal of a nitride of a group 13 element in a melt by flux method. The melt is generated by heating a composition including a material for the group 13 element, a material for at least one of an alkali metal and an alkaline earth metal and a liquid material for germanium. Upon producing a crystal of a nitride of a group 13 element in a melt by flux method, it is thereby possible to reduce in-plane distribution of a property such as carrier density of the thus obtained crystal of a nitride of a group 13 element.

12 Claims, No Drawings

METHOD OF PRODUCING CRYSTALS OF NITRIDES OF GROUP 13 ELEMENTS AND MELT COMPOSITIONS

This application is a Continuation of, and claims priority under 35 U.S.C. §120 to, International Application No. PCT/JP2013/060412, filed Mar. 29, 2013, and claims priority therethrough under 35 U.S.C. §119 to Japanese Patent Application No. 2012-079387, filed Mar. 30, 2012, the entireties of which are incorporated by reference herein

TECHNICAL FIELD OF THE INVENTION

The present invention relates to a method of producing a crystal of a nitride of a group 13 element and a metal composition.

BACKGROUND ARTS

Gallium nitride (GaN) thin film crystal draws attention as excellent blue light-emitting devices, has been used as a material for light-emitting diodes and expected as a blue-violet semiconductor laser device for an optical pickup. Recently, it draws attention as a semiconductor layer constituting electronic devices, such as high-speed IC chips, used for mobile phones or the like.

According to Patent document 1 (Japanese Patent No. 4223540B), upon growing a crystal of a nitride of a group 13 element by Na flux method, it is described to use germanium metal as a dopant. Further, according to Patent document 2 (Japanese Patent publication No. 2010-001209A), it is proposed to use germanium metal, as well as carbon, as dopants into a crystal of a nitride of a group 13 element in Na flux method, so as to grow an n-type single crystal having a high electron density.

SUMMARY OF THE INVENTION

According to prior arts, germanium metal is added to a melt composition to dope it into the resultant gallium nitride crystal. The inventors actually grew a crystal wafer such as gallium nitride and measured its in-plane distribution of a carrier density. As a result, it was observed that a difference, approaching three-fold for example, in the carrier density in a plane of the wafer. In the case that in-plane distribution of the carrier density is observed, such crystal cannot be used for products to result in defectives. It is thus needed to solve the problem.

An object of the present invention is, in producing a crystal of a nitride of a group 13 element in a melt by flux method, to reduce in-plane distribution of a property, such as carrier density, in the thus obtained crystal of a nitride of a group 13 element.

The present invention provides a method of producing a crystal of a nitride of a group 13 element in a melt by flux method. The method includes the step of heating a composition comprising a material for the group 13 element, a material for at least one of an alkali metal and an alkaline earth metal and a liquid material for germanium to generate the melt.

The present invention further provides a melt composition for growing a crystal of a nitride of a group 13 element in a melt by flux method, the composition comprising a material for the group 13 element, a material for at least one of an alkali metal and an alkaline earth metal and a liquid material for germanium.

The inventors have studied the cause of the in-plane distribution of carrier density generated in a wafer obtained by epitaxially growing a crystal of a nitride of a group 13 element by flux method. Since it had not been measured the in-plane distribution of carrier density in the wafer according to prior arts, it was considered that the object would have not been recognized.

As a result of research, the inventors speculated as follows. That is, germanium metal used as a dopant was a solid, uniformity of germanium during the dissolution in the flux was poor, so that the concentration of germanium doped within the thus obtained crystal was not constant in a plane of the wafer.

For example, in the case that sodium, gallium and germanium are charged in a crucible for growing gallium nitride, the respective weights are about 60 grams, 60 grams and 0.6 gram, respectively, for example. Further, the melting points at an ambient pressure of sodium, gallium and germanium are 97, 30 and 938° C., respectively. It is thus considered that Na and Ga each of a larger amount and having a lower melting point could be agitated sufficiently, to provide uniform solution, during the process of elevating a pressure to about 20 to 60 atms and a temperature to 750 to 900° C., and that Ge tends to be unevenly distributed in the solution.

Thus, the inventors had paid the attention to the fact that germanium metal is a solid, and then had reached the idea of using a liquid germanium compound as a dopant added to the composition. As a result, it was found that the in-plane distribution of a property such as carrier density of the thus obtained crystal was proved to be considerably reduced, and reached the present invention.

EMBODIMENTS OF THE INVENTION

A liquid material for germanium means a germanium compound which is liquid at an ambient temperature (25° C.) and an atmospheric pressure. Since the liquid germanium compound is mixed with the other materials, the uniformity of germanium in the melt can be made better than that obtained by using solid germanium metal. It is thus considered that the concentration of germanium element incorporated into the crystal can be made uniform in a plane of a wafer.

The germanium compound, which is liquid at an ambient temperature may be an inorganic germanium compound or an organic germanium compound. Preferably, it may be a germanium tetrahalide or tetraalkoxy germanium.

The germanium tetrahalide includes $GeBr_4$ (germanium tetrabromide), $GeCl_4$ (germanium tetrachloride) and $GeI_4$ (germanium tetraiodide) (Ge represents germanium atom).

An alkoxy group constituting the tetraalkoxy germanium includes $Ge(OCH_3)_4$ (tetramethoxy germanium), $Ge(OC_2H_5)_4$ (tetraethoxy germanium), $Ge(O-i-C_3H_7)_4$ (tetra-i-propoxy germanium), $Ge(O-n-C_3H_7)_4$ (tetra-n-propoxy germanium), $Ge(O-i-C_4H_9)_4$ (tetra-i-butoxy germanium), $Ge(O-n-C_4H_9)_4$ (tetra-n-butoxy germanium), $Ge(O-sec-C_4H_9)_4$ (tetra-sec-butoxy germanium) and $Ge(O-t-C_4H_9)_4$ (tetra-t-butoxy germanium).

As the flux, it is used a simple metal or compound of one or more element selected from the group consisting of alkali metals and alkaline earth metals. The alkali metal includes sodium (Na), potassium (K), rubidium (Rb), cesium (Cs) and francium (Fr). The alkaline earth metal includes strontium (Sr), barium (Ba) and radium (Ra). These may by used alone or in combination of the two or more kinds.

The group 13 element may preferably be a single kind or a plural kinds selected from gallium (Ga), aluminum (Al) and indium (In). Among these, it is preferred that at least gallium is included. Further, the thus grown semiconductor of a nitride of a group 13 element may preferably be gallium nitride (GaN) crystal. However, it may be a crystal of a nitride of a group 13 element composed of two, three or four atoms having an optional composition of a general formula: $Al_xGa_yIn_{1-x-y}N$ (each of "x", "y" and 'x+y" is 0 or larger and 1 or smaller). Further, a part of the group 13 element constituting the semiconductor of the nitride of the group 13 element $Al_xGa_yIn_{1-x-y}N$ may be substituted with B or Tl, and/or, a part of the V group element of the composition may be substituted with P, As, Sb or Bi.

As each of material substances for gallium, indium and aluminum, it may be used a simple metal of each of gallium, indium and aluminum, an alloy of each of gallium, indium and aluminum, and a compound of each of gallium, indium and aluminum. Each simple metal is preferred from the viewpoint of handling.

It is possible to further facilitate the incorporation of germanium into the crystal, by adding carbon source into the metal composition. Such carbon source includes, in addition to solid carbon, at least one compound selected from the group consisting of a chain saturated hydrocarbon, a chain unsaturated hydrocarbon, an alicyclic hydrocarbon and an aromatic hydrocarbon.

From the viewpoint of facilitating generation of the crystal growth during the flux process, the ratio of the group 13 element in the melt composition may preferably be 10 to 40 mol %, and more preferably be 15 to 30 mol %, provided that it is converted to the ratio (mol %) with respect to a total of the group 13 element, the alkali metal and alkaline earth metal.

From the viewpoint of functioning as a dopant for improving the electron density of the crystal, the ratio of the germanium compound in the metal composition may preferably be 0.05 mol % or higher, and more preferably be 0.5 mol % or higher, provided that it is converted to a ratio (mol %) of an atomic molar amount of germanium with respect to an atomic molar amount of the group 13 element such as gallium or the like. Further, the ratio of the germanium compound in the metal composition may preferably be 10 mol % or lower, and more preferably be 8 mol % or lower, provided that it is converted to a ratio (mol %) of an atomic molar amount of germanium with respect to an atomic molar amount of the group 13 element such as gallium or the like.

From the viewpoint of facilitating the doping of germanium into the crystal, the ratio of the carbon source in the melt composition may preferably be 0.1 mol % or higher, and more preferably be 0.3 mol % or higher, provided that it is converted to a ratio (mol %) of an atomic molar amount of carbon with respect to a total of atomic molar amounts of the alkali metal and alkaline earth metal. Further, the ratio of the carbon source in the melt composition may preferably be 2 mol % or lower, and more preferably be 1 mol % or lower, provided that it is converted to a ratio (mol %) of an atomic molar amount of carbon with respect to a total of atomic molar amounts of the alkali metal and alkaline earth metal.

According to the present invention, the substrate may be made of a seed crystal. Alternatively, a seed crystal film may be formed on the substrate, and in this case, a low temperature buffer layer and an intermediate layer may be further formed thereon. Such substrate is not particularly limited, as far as it is possible to grow the crystal of nitride of the group 13 element. It may be used sapphire, silicon single crystal, SiC single crystal, MgO single crystal, ZnO single crystal, spinel ($MgAl_2O_4$), $LiAlO_2$, $LiGaO_2$, and perovskite composite oxides such as $LaAlO_3$, $LaGaO_3$ and $NdGaO_3$. Also, it is possible to use cubic perovskite structure composite oxides represented by the composition formula $[A_{1-y}(Sr_{1-x}Ba_x)_y]$ $[(Al_{1-z}Ga_z)_{1-u} \cdot D_u]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2). In addition, SCAM ($ScAlMgO_4$) may be also used.

The wurtzite-type structure of the nitride of a Group 13 element forming the seed crystal or grown by flux method includes c-face, a-face and m-face. Each of these crystalline faces are defined based on crystallography. The seed crystal layer and single crystal grown by flux method may be grown in the direction normal with respect to c-face, or in the direction normal with respect to a non-polar face, such as a-face and m-face, or a semi polar face such as R-face.

The seed crystal layer may preferably be formed by a vapor phase growth method including metal organic chemical vapor deposition (MOCVD), hydride vapor phase epitaxy (HVPE), pulse-excited deposition (PXD), MBE and sublimation techniques. Metal organic chemical vapor deposition is most preferred.

In the case that the seed crystal film is produced by metal organic chemical vapor deposition, the raw materials may preferably be trimethyl gallium (TMG) and ammonia.

Further, although the mirror index of the crystal growth face of the seed crystal (including the seed crystal substrate) is optional, in the case that a non-polar face such as a-face, m-face, r-face or the like is used, it is possible to obtain a non-polar compound semiconductor of the nitride of the group 13 element, to prevent piezoelectric strain and to improve properties as a semiconductor device. In the case that a non-polar face is used as the seed crystal, it is desirable to add strontium (Sr) into the melt. In the case that sodium is used in the melt, the added content of strontium (Sr) with respect to sodium may preferably be 0.001 mol % or higher and 0.1 mol % or lower. By adding strontium, the non-polar face can be made flat, which is a crystal growth face parallel with a main face of the growth substrate on which the compound semiconductor of a nitride of a group 13 element is grown. Further, in the case that it is obtained the compound semiconductor of a nitride of a group 13 element whose main face is a c-face, the crystal growth face of the seed crystal may be made c-face.

Before the initiation of the crystal growth of the target crystal by flux method, for preventing, or reducing, the dissolution of the seed crystal (compound semiconductor crystal of a nitride of a group 13 element), forming a part of the underlying substrate, into the melt, it may be contained in the melt, in advance, a nitride such as $Ca_3N_2$, $Li_3N$, $Na_3N$, BN, $Si_3N_4$, InN or the like. By incorporating these nitrides into the melt, the nitrogen content of the melt is raised, so that it becomes possible to prevent, or to reduce, the dissolution of the seed crystal into the melt before the initiation of the growth of the target crystal in advance. The ratio of these nitrides in the melt may preferably be 0.0001 mol % to 99 mol %, more preferably 0.001 mol % to 50 mol % and most preferably be 0.005 mol % to 5 mol %.

The growth temperature of the single crystal of a nitride of a Group 13 element and holding time for the growth in flux method are not particularly limited, and appropriately adjusted depending on the kind of the target single crystal and composition of flux. For example, in the case that gallium nitride single crystal is grown using flux containing sodium or lithium, the growth temperature may be made 800 to 1000° C.

According to flux method, the single crystal of a nitride of a group 13 element is grown under gas atmosphere containing molecules including nitrogen atoms. Although the gas may preferably be nitrogen gas, it may be ammonia. Although the total pressure of the atmosphere is not particularly limited, from the viewpoint of preventing evaporation of flux, it may preferably be 1 MPa or higher and more preferably be 3 MPa or higher. However, as the pressure becomes higher, the system tends to be larger, and the total pressure may preferably be 200 MPa or lower and more preferably be 50 MPa or lower. Although a gas other than nitrogen in the atmosphere is not limited, it may preferably be an inert gas and more preferably be argon, helium or neon.

EXAMPLES

Example 1

Gallium nitride single crystal was grown according to flux method. Specifically, on a surface of a c-face sapphire body having a diameter of 2 inches, a seed crystal layer of gallium nitride single crystal was epitaxially grown by MOCVD method to provide a seed crystal substrate.

It was used an alumina cylindrical crucible with a flat bottom having an inner diameter of 80 mm and a height of 45 mm, and melt composition was filled in the crucible within a glove box. The composition was as follows.

Ga metal: 60 grams
Na metal: 60 grams
Germanium tetrachloride: 1.85 gram (ratio with respect to Ga metal was 1.0 mol %)

After the crucible was contained and sealed in a container made of a heat-resistant metal, the container was mounted on a table, in a crystal growth furnace, which can be rotated and shaken. After the temperature was raised to 870° C. and pressure was raised to 4.0 MPa, it was held for 50 hours while the solution was agitated by rotating to perform the crystal growth. Thereafter, the temperature was gradually cooled to room temperature over 3 hours. Thereafter, the growth container was drawn out from the crystal growth furnace and the flux was removed using ethanol to collect the thus grown gallium nitride crystal plate.

The thus obtained gallium nitride crystal plate was grown over the whole surface of the seed crystal substrate of 2-inches, and its thickness was about 0.7 mm. Further, it was lifted off from the sapphire body over the whole surface to provide a self-standing body with no cracks observed.

Then, the wafer of 2 inches was cut out in a radial direction from the center of the wafer to obtain samples of 6 mm×6 mm, and the Hall effects were measured. As a result, the carrier density in the sample was proved to be $1.0 \times 10^{18}$ to $1.2 \times 10^{18}$ [cm$^{-3}$] and the average value was $1.1 \times 10^{18}$ [cm$^{-3}$].

Example 2

Gallium nitride single crystal was grown according to flux method.

Specifically, on a surface of a c-face sapphire body having a diameter of 2 inches, a seed crystal layer of gallium nitride single crystal was epitaxially grown by MOCVD method to provide a seed crystal substrate.

It was used an alumina cylindrical crucible with a flat bottom having an inner diameter of 80 mm and a height of 45 mm, and melt composition was filled in the crucible within a glove box. The composition was as follows.

Ga metal: 60 grams
Na metal: 60 grams
Germanium tetrachloride: 1.85 gram (ratio with respect to Ga metal was 1.0 mol %)

After the crucible was contained and sealed in a container made of a heat-resistant metal, the container was mounted on a table, in a crystal growth furnace, which can be rotated and shaken. After the temperature was raised to 870° C. and pressure was raised to 4.0 MPa, it was held for 50 hours while the solution was agitated by rotating to perform the crystal growth. Thereafter, the temperature was gradually cooled to room temperature over 3 hours. Thereafter, the growth container was drawn out from the crystal growth furnace and the flux was removed using ethanol to collect the thus grown gallium nitride crystal plate.

The thus obtained gallium nitride crystal plate was grown over the whole surface of the seed crystal substrate of 2-inches, and its thickness was about 0.7 mm.

Further, the sapphire body and the thus obtained gallium nitride crystal were not lifted off from each other, and the wafer of 2 inches was cut out in a radial direction from the center of the wafer to obtain samples of 6 mm×6 mm, and the Hall effects were measured. As a result, the carrier density in the sample was proved to be $1.0 \times 10^{18}$ to $1.2 \times 10^{18}$ [cm$^{-3}$] and the average value was $1.1 \times 10^{18}$ [cm$^{-3}$], which were same as those obtained in the case the thus obtained gallium nitride was lifted off from the sapphire body. It is considered that, as the sapphire body is an insulating material, a current was not applied during the measurement of Hall effects.

Example 3

Gallium nitride single crystal was grown according to the same procedure as the Example 1 and Hall effects were measured as to the thus obtained samples.

However, the melt composition was made as follows.
Ga metal: 60 grams
Na metal: 60 grams
Germanium tetrachloride: 1.85 gram (ratio with respect to Ga metal was 1.0 mol %)
Carbon: 0.16 gram (ratio with respect to Na metal was 0.5 mol %)

Then, the wafer of 2 inches was cut out in a radial direction from the center of the wafer to obtain samples of 6 mm×6 mm, and the Hall effects were measured. As a result, the carrier density in the sample was proved to be $1.3 \times 10^{18}$ to $1.5 \times 10^{18}$ [cm$^{-3}$] and the average value was $1.4 \times 10^{18}$ [cm$^{-3}$]. That is, the carrier density was increased by about 20 percent than that in the Example 1.

Example 4

Gallium nitride single crystal was grown according to the same procedure as the Example 1 and Hall effects were measured as to the thus obtained samples.

However, the melt composition was made as follows.
Ga metal: 60 grams
Na metal: 60 grams
Ge(OC$_2$H$_5$)$_4$ (tetraethoxy germanium: 2.17 grams (ratio with respect to Ga metal was 1.0 mol %)

Then, the wafer of 2 inches was cut out in a radial direction from the center of the wafer to obtain samples of 6 mm×6 mm, and the Hall effects were measured. As a result, the carrier density in the sample was proved to be $2.0 \times 10^{18}$ to $2.2 \times 10^{18}$ [cm$^{-3}$] and the average value was $2.1 \times 10^{18}$ [cm$^{-3}$]. That is, the carrier density was increased by about two-fold than that in the Example 1. Although the reasons are not clear, it is speculated that ethoxy group of the liquid Ge material functions as a carbon source.

Example 5

Gallium nitride single crystal was grown according to the same procedure as the Example 1 and Hall effects were measured as to the thus obtained samples.

However, the melt composition was made as follows.
Ga metal: 60 grams
Na metal: 60 grams
Ge(OC$_2$H$_5$)$_4$ (tetraethoxy germanium: 2.17 gram (ratio with respect to
Ga metal was 1.0 mol %)
Carbon: 0.047 grams (ratio with respect to Na metal was 0.15 mol %)
Then, the wafer of 2 inches was cut out in a radial direction from the center of the wafer to obtain samples of 6 mm×6 mm, and the Hall effects were measured. As a result, the carrier density in the sample was proved to be 2.1×10$^{18}$ to 2.3×10$^{18}$ [cm$^{-3}$] and the average value was 2.2×10$^{18}$ [cm$^{-3}$]. That is, the carrier density was slightly increased than that in the Example 3.

Example 6

Gallium nitride single crystal was grown according to the same procedure as the Example 1 and Hall effects were measured as to the thus obtained samples.
However, the melt composition was made as follows.
Ga metal: 60 grams
Na metal: 60 grams
Germanium tetrachloride: 3.7 gram (ratio with respect to Ga metal was 2.0 mol %)
Then, the wafer of 2 inches was cut out in a radial direction from the center of the wafer to obtain samples of 6 mm×6 mm, and the Hall effects were measured. As a result, the carrier density in the sample was proved to be 1.9×10$^{18}$ to 2.2×10$^{18}$ [cm$^{-3}$] and the average value was 2×10$^{18}$ [cm$^{-3}$]. That is, by increasing the charged content of the liquid Ge material in the composition by two fold than that in the Example 1, the carrier density was increased by about two fold than that in the Example 1. Moreover, the in-plane deviation of the carrier density was smaller.

Example 7

Gallium nitride single crystal was grown according to the same procedure as the Example 1 and Hall effects were measured as to the thus obtained samples.
However, the melt composition was made as follows.
Ga metal: 60 grams
Na metal: 60 grams
Germanium tetrachloride: 5.55 grams (ratio with respect to Ga metal was 3.0 mol %)
Then, the wafer of 2 inches was cut out in a radial direction from the center of the wafer to obtain samples of 6 mm×6 mm, and the Hall effects were measured. As a result, the carrier density in the sample was proved to be 3.0×10$^{18}$ to 3.3×10$^{18}$ [cm$^{-3}$] and the average value was 3.2×10$^{18}$ [cm$^{-3}$]. That is, by increasing the charged content of the liquid Ge material in the composition by three fold than that in the Example 1, the carrier density was increased by about three fold than that in the Example 1.

Comparative Example 1

Gallium nitride single crystal was grown according to the same procedure as the Example 1 and Hall effects were measured as to the thus obtained samples.
However, the melt composition was made as follows.
Ga metal: 60 grams
Na metal: 60 grams
Solid germanium metal: 0.62 gram (ratio with respect to Ga metal was 1.0 mol %)

Carbon: 0.16 grams (ratio with respect to Na metal was 0.5 mol %)
Then, the wafer of 2 inches was cut out in a radial direction from the center of the wafer to obtain samples of 6 mm×6 mm, and the Hall effects were measured. As a result, the carrier density in the sample was proved to be 0.4×10$^{18}$ to 1.1×10$^{18}$ [cm$^{-3}$] and the average value was 0.7×10$^{18}$ [cm$^{-3}$]. That is, the carrier density was as small as about a half of that in the Example 1 and the deviation was larger.

Comparative Example 2

Gallium nitride single crystal was grown according to the same procedure as the Example 1 and Hall effects were measured as to the thus obtained samples.
However, the melt composition was made as follows.
Ga metal: 60 grams
Na metal: 60 grams
Solid germanium metal: 1.24 gram (ratio with respect to Ga metal was 2.0 mol %)
Then, the wafer of 2 inches was cut out in a radial direction from the center of the wafer to obtain samples of 6 mm×6 mm, and the Hall effects were measured. As a result, the carrier density in the sample was proved to be 0.7×10$^{18}$ to 1.8×10$^{18}$ [cm$^{-3}$] and the average value was 1.0×10$^{18}$ [cm$^{-3}$]. That is, as the content of the germanium material was made two fold of that in the comparative Example 1, the carrier density was not increased by two fold, and Comparative Example 3

Gallium nitride single crystal was grown according to the same procedure as the Example 1 and Hall effects were measured as to the thus obtained samples.
However, the melt composition was made as follows.
Ga metal: 60 grams
Na metal: 60 grams
Solid germanium metal: 1.86 gram (ratio with respect to Ga metal was 3.0 mol %)
Then, the wafer of 2 inches was cut out in a radial direction from the center of the wafer to obtain samples of 6 mm×6 mm, and the Hall effects were measured. As a result, the carrier density in the sample was proved to be 1.0×10$^{18}$-2.2×10$^{18}$ [cm$^{-3}$] and the average value was 1.5×10$^{18}$ [cm$^{-3}$]. That is, as the content of the germanium material was made three fold of that in the comparative Example 1, the carrier density was not increased by three fold, and the deviation was further increased.

The invention claimed is:

1. A method of producing a crystal of a nitride of a group 13 element in a melt by flux method, the method comprising the step of:
   heating a composition comprising a material for said group 13 element, a material for at least one of an alkali metal and an alkaline earth metal and a liquid material for germanium to generate said melt, wherein said liquid material for germanium is liquid at 25° C. under atmospheric pressure.

2. The method of claim 1, wherein said composition further comprises a carbon source.

3. The method of claim 1, wherein said group 13 element comprises at least one of gallium and aluminum.

4. A method of producing a crystal of a nitride of a group 13 element in a melt by flux method, the method comprising the step of:
   heating a composition comprising a material for said group 13 element, a material for at least one of an alkali metal and an alkaline earth metal and a liquid material for germanium to generate said melt, wherein said material for germanium comprises a germanium tetrahalide.

5. A method of producing a crystal of a nitride of a group 13 element in a melt by flux method, the method comprising the step of:
heating a composition comprising a material for said group 13 element, a material for at least one of an alkali metal and an alkaline earth metal and a liquid material for germanium to generate said melt, wherein said material for germanium comprises an organic germanium compound.

6. The method of claim 5, wherein said organic germanium compound comprises a tetraalkoxy germanium.

7. A melt composition for growing a nitride of a group 13 element in a melt by flux method, said melt being generated by heating said composition, said composition comprising:
a material for said group 13 element;
a material for at least one of an alkali metal and an alkaline earth metal; and
a liquid material for germanium,
wherein said liquid material for germanium is liquid at 25° C. under atmospheric pressure.

8. The composition of claim 7, wherein said composition further comprises a carbon source.

9. The composition of claim 7, wherein said group 13 element comprises at least one of gallium and aluminum.

10. A melt composition for growing a nitride of a group 13 element in a melt by flux method, said melt being generated by heating said composition, said composition comprising:
a material for said group 13 element;
a material for at least one of an alkali metal and an alkaline earth metal; and
a liquid material for germanium,
wherein said material for germanium comprises a germanium tetrahalide.

11. A melt composition for growing a nitride of a group 13 element in a melt by flux method, said melt being generated by heating said composition, said composition comprising:
a material for said group 13 element;
a material for at least one of an alkali metal and an alkaline earth metal; and
a liquid material for germanium,
wherein said material for germanium comprises an organic germanium compound.

12. The composition of claim 11, wherein said organic germanium compound comprises a tetraalkoxy germanium.

* * * * *